United States Patent [19]
Fujino et al.

[11] Patent Number: 5,966,340
[45] Date of Patent: Oct. 12, 1999

[54] SEMICONDUCTOR MEMORY DEVICE HAVING HIERARCHICAL WORD LINE STRUCTURE

[75] Inventors: Takeshi Fujino; Masaki Tsukude, both of Hyogo, Japan

[73] Assignee: Mitsubishi Denki Kabushiki Kaisha, Tokyo, Japan

[21] Appl. No.: 08/960,286

[22] Filed: Oct. 29, 1997

[30] Foreign Application Priority Data

Mar. 26, 1997 [JP] Japan ............................ 9-073662(P)

[51] Int. Cl.⁶ .................................................. G11C 8/00
[52] U.S. Cl. ..................... 365/230.03; 365/53; 365/63; 365/226
[58] Field of Search ................... 365/230.03, 230.06, 365/185.11, 185.13, 226, 53, 63

[56] References Cited

U.S. PATENT DOCUMENTS 5,282,175  1/1994  Fujita et al. ................. 365/230.06
5,587,959  12/1996 Tsukude ........................ 365/230.06

FOREIGN PATENT DOCUMENTS 3-165559  7/1991  Japan .
6-195966  7/1994  Japan .

*Primary Examiner*—David Nelms
*Assistant Examiner*—Hoai V. Ho
*Attorney, Agent, or Firm*—McDermott, Will & Emery

[57] ABSTRACT

Conductive lines for electrostatic shielding including at least one signal line are arranged between a global data I/O bus line and a ground line transmitting a ground voltage to a nonselected word line through a sub-decoder. Capacitive coupling between bus lines included in the global data I/O bus and the ground line is suppressed, and floating up of a ground voltage on the nonselected word line is prevented.

11 Claims, 9 Drawing Sheets

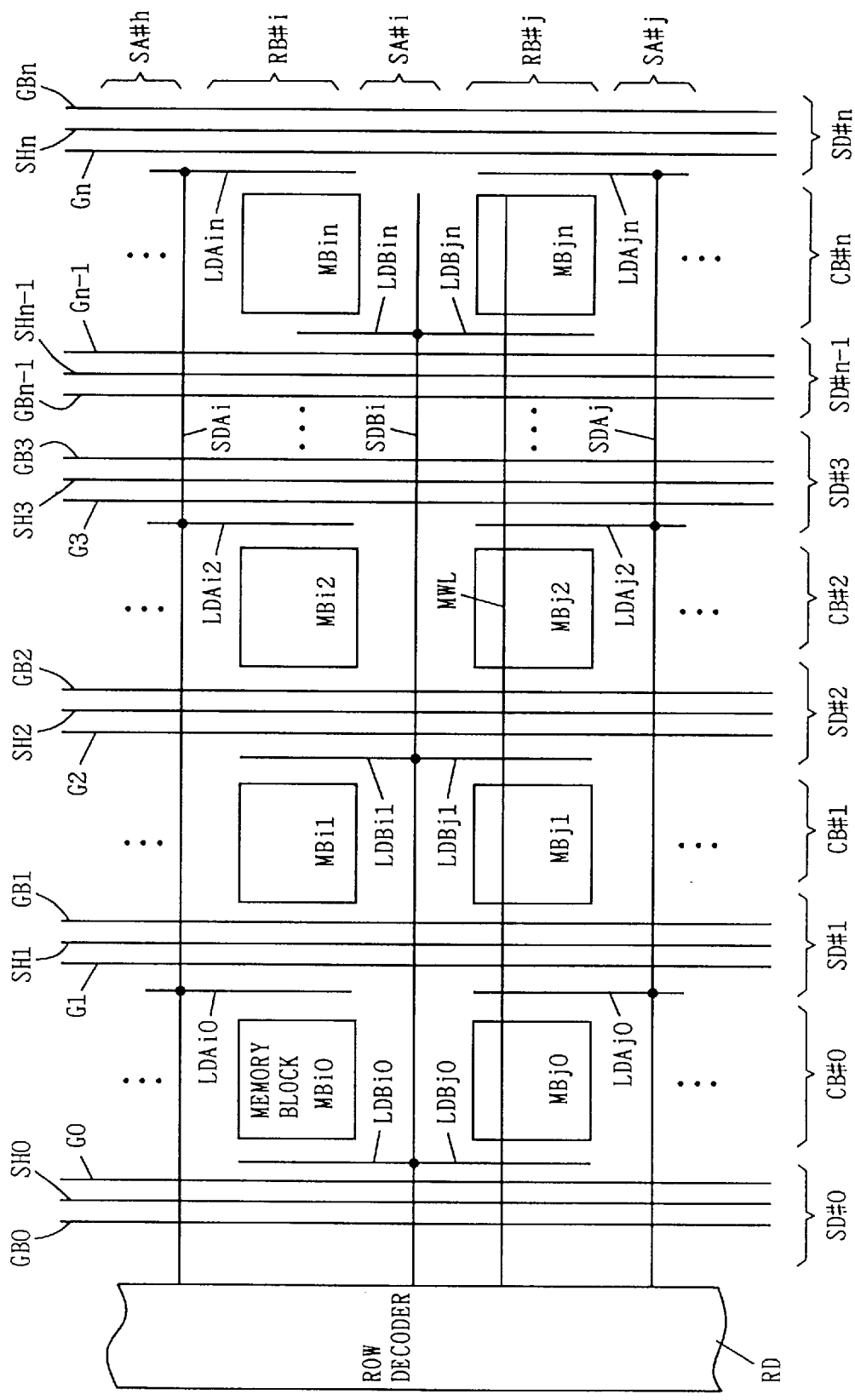
F I G. 1

DATA OF SELECTED MEMORY CELL

SEMICONDUCTOR MEMORY DEVICE HAVING HIERARCHICAL WORD LINE STRUCTURE

BACKGROUND OF THE INVENTION

1. Field of the Invention

The present invention relates to a semiconductor memory device, and in particular to a semiconductor memory device in which word lines are hierarchized into main word lines and sub-word lines, and data lines are hierarchized into local data lines and global data lines. More particularly, the invention relates to a dynamic random access memory having a hierarchical word line structure and a hierarchical data input/output line structure. More specifically, the invention relates to an arrangement of hierarchical data lines in the dynamic random access memory having the hierarchical word line structure and the hierarchical data line structure.

2. Description of the Background Art

FIG. 8 schematically shows a structure of a memory cell array in a semiconductor memory device in the prior art. In FIG. 8, the memory array in this semiconductor memory device is divided into a plurality of memory blocks MB00-MBnm each having a plurality of memory cells MC arranged in rows and columns. The memory blocks aligned in the column direction form column blocks CB#0-CB#n respectively, and the memory blocks aligned in the row direction form row blocks RB#0-RB#n, respectively. For example, memory blocks MB00, MB10, . . . , MBn0 form a column block CB#0, and memory blocks MB00, MB01, . . . , MB0m form a row block RB#0.

A word line WL is arranged commonly for the memory blocks included in a row block. A column select line CSL is arranged commonly for the memory blocks included in a column block. A row decoder RD transmits a word line select signal onto word lines WL, and a column decoder CD transmits a column select signal onto column select lines CSL.

For each of memory blocks MB00-MBnm, there are arranged local data I/O buses LIO00-LIOnm extending in the row direction, respectively. These local data I/O buses LIO00-LIOnm are arranged along the row direction only within regions at which corresponding memory blocks MB00-MBnm are arranged, respectively. Global data I/O buses GIO0-GIOm are arranged in the column direction for column blocks CB#0-CB#m, respectively. Global data I/O buses GIO0-GIOm are provided for the memory blocks included in the corresponding column blocks CB#0 to CB#m, respectively. For example, global data I/O bus GIO0 is commonly provided for memory blocks MB00, MB10, . . . , MBn0 included in column block CB#0.

Local data I/O buses LIOji are selectively connected to global data I/O bus GIOj by a not shown row block select gate which is turned on in response to a row block select signal. The local data I/O bus, which is provided for the memory block included in the selected row block, is connected to the corresponding global data I/O bus.

By providing a hierarchical structure of the data I/O buses formed of local data I/O buses LIO and global data I/O buses, input and output of multi-bit data can be performed easily. Further, by arranging the global data I/O buses at regions (word line shunt regions) between the memory blocks, it is possible to suppress increase of an area occupied by the global data I/O buses, and therefore input and output of multi-bit data can be performed easily without increasing an area occupied by the array. The memory array has a row block driven to the selected state at a time, and the nonselected row blocks can be kept at a precharged state, whereby a current consumption can be reduced.

The global data I/O buses GIO0-GIOm and local data I/O buses LIO00-LIOnm have bus widths appropriately determined, respectively.

FIG. 9 shows a structure of memory cell MC shown in FIG. 8. In FIG. 9, memory cell MC has a capacitor MQ for storing information, and an access transistor MT formed of an n-channel MOS transistor which is turned on in response to a signal potential on word line WL and thereby connects capacitor MQ to a bit line BL. Another memory cell is arranged at a crossing between a complementary bit line /BL and another word line (not shown). This structure is called a "folded bit line" structure. Memory capacitor MQ receives on one electrode node a constant reference voltage VCP which is usually half the power supply voltage, and stores, on the other electrode node (i.e., storage node), electric charges which are positive or negative with reference to voltage VCP. When reading data, a potential on bit line BL, which changes in accordance with data stored in memory cell MC, is differentially amplified with the reference voltage at a precharge voltage on complementary bit line /BL.

Memory cell MC shown in FIG. 9 stores information in capacitor MQ in an electric charge form. When the charges are reduced due to a leak current to a substrate or bit line BL, the stored information would be lost. In order to prevent the loss of stored information, restoring of data is periodically performed at predetermined intervals. This restoring is call refreshing. During this refreshing, external devices cannot access this semiconductor memory device. Further, charging and discharging of the bit lines BL and /BL are performed during the refreshing. Therefore, in order to reduce the current consumption and suppress reduction in access efficiency, the refresh period is set as long as possible.

A larger storage capacity of the semiconductor memory device requires a larger array area. For example, a memory device of 256 Mbits has a storage capacity four times larger than that of a memory device of 64 Mbits. According to simple calculation, therefore, memory cells in the memory device of 256 Mbits must be double in number in both the row and column directions, so that memory cells connected to each word line WL increase in number, and lengths of interconnections of word lines also increase. The increase in length of word lines WL and the increase in number of the memory cells result in increase in interconnection resistance and interconnection capacitance of word lines WL, so that word lines WL cannot be driven rapidly to the selected state, and therefore the access time increases.

For fast driving of the word lines in the semiconductor memory device of a large capacity, such a manner may be employed that the word lines are divided into main word lines and sub-word lines actually connected to memory cells for allowing fast transmission of a word line select signal to an end of the main word line.

FIG. 10 schematically shows a structure of an array in a semiconductor memory device having such a hierarchical word line structure formed of main word lines and sub-word lines. FIG. 10 shows memory blocks MBia-MBkb included in two column blocks in three row blocks RB#i, RB#j and RB#k. Memory blocks MBia, MBja and MBka are included in column block CB#a, and memory blocks MBib, MBjb and MBkb are included in column block CB#b. Row block RB#i includes memory blocks MBia and MBib. Row block RB#j includes memory blocks MBja and MBjb. Row block RB#k includes memory blocks MBka and MBkb.

In each of memory blocks MBia-MBkb, a sub-word line SWL is arranged for each row of the memory cells. The memory cells in the corresponding rows are connected to these sub-word lines SWL, respectively. In each row block, a main word line MWL is arranged commonly to the memory blocks included in the same row block. The main word line MWL is arranged commonly to sub-word lines SWL arranged for the corresponding row in the corresponding row block. Therefore, main word line MWL extends entirely over the corresponding row block, and the sub-word line SWL extends in the row direction only within the corresponding memory block.

A sense amplifier band SA#a including sense amplifiers, which will be described later, is arranged in a region extending in the row direction between row blocks RB#i and RB#j. A sense amplifier band SA#b including sense amplifiers is arranged in a region extending in the row direction between row blocks RB#j and RB#k. The sense amplifiers in sense amplifier bands SA#a and SA#b have a so-called shared sense amplifier structure, and are operable to sense and amplify memory cell data in the corresponding columns in the adjacent memory blocks. Sense amplifier bands SA#a and SA#b are provided with local data I/O buses, which extend in the row direction within the corresponding memory block regions, respectively, but are not shown in FIG. 10 for simplifying the figure.

In the sense amplifier band SA#a, there is further arranged a sub-decode signal line SDA which extends in the row direction for transmitting a sub-decode signal from row decoder RD. Likewise, a sub-decode signal line SDB is arranged in the sense amplifier band SA#b for transmitting a sub-decode signal from row decoder RD. As will be described later in detail, main word line MWL simultaneously sets a plurality of (e.g., four) sub-word lines in one memory block to the selected or designated state, and one of the sub-word lines designated by the main word line is selected in accordance with the sub-decode signals on sub-decode signal lines SDA and SDB.

Sub-decoders for driving the sub-word lines to the selected state in accordance with the signal potential on the main word line MWL and the sub-decode signal are arranged in a sub-decode band SD#a, which extends in the column direction through a region between column blocks CB#a and CB#b. Likewise, sub-decoders which drive the sub-word lines to the selected state in accordance with the signal potential on the main word line and sub-decode signal SDA are arranged in a sub-decode band SD#b between column block CB#b and adjacent column block (not shown).

Sub-decode signal line SDB transmits a sub-decode signal through local sub-decode signal lines SDBa and SDBb, which are arranged along the column direction for memory blocks MBja and MBka, in sub-decode band SD#a, respectively. Sub-decode signal line SDA transmits a sub-decode signal to memory blocks MBib and MBjb through local sub-decode signal lines SDAa and SDAb, which extends only along memory blocks MBib and MBjb in the column direction, respectively.

Local sub-decoded signal lines for sub-decode signal lines SDA and SDB are arranged extending in the column direction and are arranged alternately in the sub-decode bands SD#a and SD#b, respectively. Thereby, one memory block (e.g., MB#jb) is driven such that the sub-word lines at the opposite sides thereof are driven by the sub-decoders included in the sub-decode bands SD#a and SD#b. Therefore, the sub-decoder included in the sub-decode band SD#a is commonly used by two memory blocks neighboring to each other in the row direction, and the sub-decoder included in the sub-decode band SD#b is commonly used by two memory blocks neighboring to each other in the row direction. By utilizing the sub-decode signals in such a manner, it is possible to increase an allowable pitch of decode circuits included in row decoder RD. Also, by utilizing the sub-decode signals and alternately arranging the local sub-decode signal lines in the sub-decode bands, it is possible to increase an allowable pitch of sub-decoders decoding the sub-decode signals.

FIG. 11 schematically shows a structure of a portion related to one main word line MWL in one memory block MB. In FIG. 11, four sub-word lines SWL0–SWL3 are arranged for main word line MWL in memory block MB. Memory cells MC are arranged at crossings between sub-word lines SWL0–SWL3 and bit line pair BLP.

Sub-decoders SBD0–SBD3 are arranged for sub-word lines SWL0–SWL3, respectively. Sub-decoder SBD0 drives sub-word line SWL0 to the selected or nonselected state in accordance with the signal potential on main word line MWL and sub-decode signal SD0 from sub-decode signal line SDA. Sub-decoder SBD1 drives corresponding sub-word line SWL1 to the selected state in accordance with the signal potential on main word line MWL and sub-decode signal SD1 on sub-decode signal line SDB. Sub-decoder SBD2 drives sub-word line SWL2 to the selected state in accordance with the signal potential on main word line MWL and sub-decode signal SD2 from sub-decode signal line SDA. Sub-decoder SBD3 drives sub-word line SWL3 to the selected state in accordance with the signal potential on main word line MWL and sub-decode signal SD3 from sub-decode signal line SDB. Sub-decoders SBD0 and SBD2 are arranged at one side of the memory block MB, and sub-decoders SBD1 and SBD3 are arranged at the other side of the memory block MB. Thus, a so-called "alternated sub-decoder arrangement" is employed. Thereby, a pitch of the sub-decoders in the column directions is equal to two pitches of the sub-word lines, so that the sub-decoders can be arranged without a difficulty. Sub-decode signals SD0–SD3 are obtained by decoding, e.g., least significant 2 bits of row address signal, and are adapted to specify one of four sub-word lines SWL0–SWL4.

By using the hierarchical word line structure shown in FIG. 11, the word line can be rapidly driven to the selected state as shown in FIG. 12.

FIG. 12 schematically shows a structural relationship between main word line MWL and sub-word lines SWLj0-SWLjn in row block RB#j. The signal potential on main word line MWL is transferred to sub-decoders SBD#0-SBD#p. Sub-decoder SBD#0 drives sub-word lines SWLj0 and SWLh, and sub-decoder SBD#1 drives sub-word lines SWLj2 and SWLj3. Sub-decoder SBD#p drives sub-word lines SWLj(n–1) and SWLjn.

Sub-decoders SBD#0-SBD#p are arranged in the sub-decode band as shown in FIG. 10. Sub-decode bands SD#a and SD#b are regions between the memory blocks corresponding to so-called word line shunt regions, i.e., regions where no memory cell is present. Sub-decoders SBD#0-SBD#b are arranged at the word line shunt regions, respectively. Main word line MWL and sub-decode signal lines SDA and SDB are not connected to the memory cell, and therefore can transmit signals at a high speed. Therefore, arrangement of sub-decoders SBD#0-SBD#p at the word line shunt regions allows fast driving of sub-word lines SWLJ0-SWLjn connected to the memory cells to the selected state, so that the row select operation can be performed by driving the word lines to the selected state at a high speed even if the storage capacity is large.

FIG. 13 shows more specifically the structures of sub-decode bands SD#a and SD#b and sense amplifier bands SA#a and SA#b for memory block MB#jb shown in FIG. 10. FIG. 13 representatively shows sub-decoders SBD2 and SBD3 for two sub-word lines SWL2 and SWL3 included in memory block MB#jb, respectively.

In memory block MB#jb, there are representatively shown four bit line pairs BLPa, BLPb, BLPc and BLPd which are simultaneously selected by one column select signal.

At sense amplifier band SA#a, there are arranged a sense amplifier SAb for differentially amplifying and latching the potentials on bit line pair BLPa and a sense amplifier SAd for differentially amplifying and latching the potentials on bit line pair BLPd. Data sensed and amplified by sense amplifiers SAb and SAd are transmitted onto local data I/O buses LIOB and LIOd extending in the column direction through column select gates (not shown), respectively.

Signals on bit line pairs BLPa and BLPc are differentially amplified and latched by sense amplifiers SAa and SAc arranged at sense amplifier band SA#b, respectively. Data sensed and amplified by sense amplifiers SAa and SAc are transmitted through local data I/O buses LIOa and LIOc arranged in sense amplifier band SA#b for memory block MBjb (column select gate is not shown). Each of these local data I/O buses LIOa–LIOd is formed of a first level aluminum interconnection layer.

At sub-decode band SD#a, there are arranged decode signal lines SD0, SD2, ZSD0 and ZSD2 extending in the column direction for transmitting decode signals SD0 and SD2 as well as complementary decode signals ZSD0 and ZSD2 (here, signals and corresponding interconnection lines are indicated by the same reference characters). There are arranged global data I/O buses GIOa and GIOb extending in the column direction. Global data I/O bus GIOa is connected to local data I/O bus LIOa through a block select gate (not shown). Global data I/O bus GIOb is connected to local data I/O bus LIOb through the block select gate (not shown) at a portion located in the sense amplifier band SA#a.

Signal lines SD0, SD2, ZSD0 and ZSD2 as well as a ground line Ga and global data I/O buses GIOa and GIOb, which are arranged in the sub-decode band SD#a, are formed of second level aluminum interconnections higher than the first level aluminum interconnection layer.

Sub-decoder SBD2 is formed at a region between signal lines SD2 and ZSD2. Sub-decoder SBD2 includes a p-channel MOS transistor P1, which is turned on to transmit sub-decode signal SD2 onto sub-word line SWL2 when a signal on main word line MWL is at L-level indicative of the selected state, an n-channel MOS transistor N1 which is turned on to transmit ground voltage GND on ground line Ga to sub-word line SWL2 when sub-decode signal ZSD2 is at H-level indicative of the nonselected state, and an n-channel MOS transistor N2 which is turned on to transmit ground voltage GND on ground line Ga to sub-word line SWL2 when the signal potential on main word line MWL is at H-level indicative of the nonselected state.

Sub-decode signals ZSD0 and SD0 are transferred to sub-decoder SBD0 (not shown) neighboring in the column direction.

Global data I/O buses GIOa and GIOb are arranged adjacent to ground line Ga, and thereby the lengths of sub-decode lines SD0, SD2, ZSD0 and ZSD2 in the row direction are reduced. The reason for this is to increase sufficiently the allowable sizes, in the row direction, for transistors P1, N1 and N2 in the sub-decoder SBD2, and align the sub-decoders in the column direction.

In the sub-decode band SD#b, global data I/O buses GIOc and GIOd formed of the second level aluminum interconnection layer extend in the column direction. Global data I/O bus GIOc has a portion, which is located in sense amplifier band SA#b connected to local data I/O bus LIOc through a block select gate (not shown). Global data I/O buses GIOd has a portion, which is located in sense amplifier band SA#a, connected to local data I/O bus LIOd through a block select gate (not shown).

In sub-decode band SD#b, there are arranged signal lines which extend in the column direction for transmitting sub-decode signals SD1, SD3, ZSD1 and ZSD3, respectively. Signal lines SD1, SD3, ZSD1 and ZSD3 do not extend beyond memory block MB#jb. Sub-decoder SBD3 includes a p-channel MOS transistor P2 which transmits sub-decode signal SD3 from signal line SD3 to sub-word line SWL3 when the signal potential on main word line MWL is at L-level, an n-channel MOS transistor N3 which is turned on to transmit ground voltage GND on ground line Gb to sub-word line SWL3 when sub-decode signal ZSD3 is at H-level, and an n-channel MOS transistor N4 which is turned on to transmit ground voltage GND on ground line Gb to sub-word line SWL3 when the signal potential on main word line MWL is at H-level.

Ground line GND and signal lines SD1, SD3, ZSD1 and ZSD3 are formed of the second level aluminum interconnections, respectively. Ground lines Ga and Gb extend in the column direction and are provided commonly for the memory blocks in the column block for transmitting the ground voltage to the sub-decoders. In this sub-decode band SD#b, global data I/O buses GIOc and GIOd are arranged adjacent to the ground line Gb. The reason for this is to keep a sufficient large distance in the row direction between signal lines SD3 and ZSD3, and thereby increase sufficiently the allowable sizes, in the row direction, for transistors P2, N4 and N3 in the sub-decoder SBD3, and align the sub-decoders in the column direction.

Signal lines SD1 and ZSD1 are connected to sub-decoder SBD1 (not shown in FIG. 13). An operation of the structure shown in FIG. 13 will be described below with reference to FIG. 14. FIG. 14 representatively shows address signal bits A0 and A1. The rest of more significant address signal bits are applied in a similar manner. Reference characters "GIOi" and "ZGIOi" indicate global data I/O lines of the data I/O bus which are complementary with each other.

Before time t0, row address strobe signal /RAS is inactive at H-level, and global data I/O lines GIOi and ZGIOi have been precharged to H-level.

At time t0, row address strobe signal /RAS falls to L-level to start the memory cycle. Address bits (A1, A0) applied at this time are (1, 0), and sub-word line SWL2 is designated among sub-word lines SWL0–SWL3, so that sub-decode signal SD2 rises to H-level.

Concurrently, the potential on main word line MWL corresponding to the addressed row falls from H-level to L-level. In the sub-decoder SBD2, p-channel MOS transistor P1 is turned on, and sub-word line SWL2 is driven to H-level. In sub-decoder SBD2, both MOS transistors N1 and N2 are turned off.

In sub-decoder SBD3, signal SD3 set to L-level is transmitted onto sub-word line SW3 through p-channel MOS transistor P2, and sub-word line SWL3 maintains the non-selected state. At this time, signal ZSD3 is at H-level, and n-channel MOS transistor N3 is turned on to transmit ground potential GND on ground line Gb to nonselected sub-word line SWL3, so that this sub-word line SWL3 is kept at the nonselected state. When this word line selection is completed, sense amplifiers SAa–SAd are activated, and the potential difference appearing on each bit line pair is differentially amplified and latched.

At time t1, column address strobe signal /CAS falls, so that the column selection operation starts. At this time, address signal bits A1 and A0 are (0, 0), and for example, bit line pair BLPa is selected. In this state, sense amplifier SAa is selected and connected to local data I/O bus LIOa, and data on local data I/O bus LIOa is transmitted onto global data I/O bus GIOa. At time t1, a write instructing signal /WE is at L-level, and writing of data "0" is instructed. Therefore, data at L-level is transmitted from global data I/O bus GIOa through local data I/O bus LIOa, and data "0" is written into the selected memory cell. At this time, data at H-level is transmitted onto global data I/O line ZGIOi. The above operation occurs on each global data I/O bus.

When data writing is completed, column address strobe signal /CAS is temporarily raised to H-level, and thereby the column select operation is completed. Then, column address strobe signal ICAS is fallen to L-level again at time t2. In this state, write data DQ is "1" at H-level. Address signal bits A1 and A0 are 0 and 1, respectively, so that another bit line pair is selected. In this state, the potential on global data I/O line GIOi rises to H-level in accordance with the write data, and the potential on complementary global data I/O line ZGIOi falls to L-level. Then, a memory cell connected to the selected bit line pair are supplied with write data on bit line pair BLP through local data I/O bus LIO. In the structure shown in FIG. 13, four columns are simultaneously selected, and data of 4 bits are written. However, FIG. 14 shows a waveform of data of only one bit.

When writing of memory cell data is completed, column address strobe signal /CAS is raised to H-level again. Upon elapsing of a predetermined period (i.e., CAS precharge period), column address strobe signal /CAS is lowered to L-level again at time t3. In this state, column address signal bits A1 and A0 are 1 and 0, respectively, and still another bit line pair is selected. Write data DQ is 0, so that data of "0" is written onto the selected bit line pair BLP through corresponding global data I/O bus GIO, corresponding local data I/O bus LIO and corresponding sense amplifier SA. Therefore, global data I/O bus line GIOi maintains L-level, and complementary global data I/O bus line ZGIOi maintains H-level. When this data writing is completed, column address strobe signal /CAS is raised to H-level, and the column select operation is completed.

At time t4, column address strobe signal /CAS is lowered to L-level. Address signal bits A1 and A0 at this time are 1 and 1, respectively, and yet another bit line pair is selected. Write data DQ is "1". Therefore, data of "1" is written onto the selected bit line pair BLP through corresponding global data I/O bus GIO, corresponding local data I/O bus LIO and corresponding sense amplifier SA. In this state, global data I/O bus lines GIOi and ZGIOi are supplied with data at H-level and L-level, respectively.

At time t5, row address strobe signal /RAS is raised to H-level, and the data write operation is completed. Thereby, the sub-row decoder is reset, so that sub-decode signal SD2 falls to L-level, and the sub-word line SWL2 attains the nonselected state of L-level.

The foregoing mode in which data writing is performed by toggling column address strobe signal /CAS with row address strobe signal /RAS held at L-level is known as a page write mode, which is employed for fast writing of data.

In the above data write operation, the potentials on bus lines GIOi and ZGIOi of each global data I/O bus fully swing between the power supply voltage and the ground voltage, so that the following problem arises.

FIG. 15 schematically shows an interconnection layout at the sub-decode band. In FIG. 15, the same interconnection layer (second level aluminum interconnection layer) provides a sub-decode signal line 900 transmitting sub-decode signal SDi, a global data I/O line 902 performing data input/output, a complementary global data I/O line 904, a ground line 906 transmitting ground voltage GND and sub-decode signal line 908 transmitting sub-decode signal ZSDi which are spaced from each other. A parasitic capacitance 910 is formed between global data I/O line 904 and ground line 906 formed of the same interconnection layer. Global data I/O line 904 receives a signal, which fully swings between the power supply voltage and the ground voltage, in the write operation.

FIG. 16 schematically shows a structure of a portion related to one nonselected memory cell. Memory cell MC is arranged between nonselected sub-word line SWL and bit line BL. Nonselected sub-word line SWL is connected to ground line 906 through a sub-decode circuit. Global data I/O line 904 neighbors to ground line 906. Memory cell MC includes capacitor MQ, and access transistor MT for connecting capacitor MQ to bit line BL in response to the signal potential on sub-word line SWL.

In the page mode operation, sense amplifier SA is active while row address strobe signal /RAS is active, and differentially amplifies and latches the potentials on bit lines BL and /BL. Therefore, the potentials on bit lines BL and /BL are held at levels of power supply voltage VCC and ground voltage GND. The operation will be discussed in connection with the state that the potential on bit line BL is held at the ground voltage level, i.e., L-level, and the potential on the complementary bit line /BL is held at the power supply voltage level, i.e., H-level in accordance with data of the memory cell connected to the selected sub-word line (not shown). It is assumed that memory cell MC has stored data at H-level.

Sub-word line SWL is nonselected, and therefore is fixed at the ground voltage level. When this sub-word line SWL attains the ground voltage level, the access transistor MT is turned off to isolate memory cell capacitor MQ from bit line BL. However, when the page mode access is performed as shown in FIG. 14, a write pulse of a predetermined time width is generated in accordance with activation of column address strobe signal /CAS, and the potential on global data bus I/O line 904 changes between the power supply voltage and ground voltage GND. After completion of writing, the potential on global data I/O line is precharged to the power supply voltage level.

Therefore, when data at L-level is transmitted onto global data I/O line 904, the potential on global data I/O line 904 returns from the ground voltage level to the power supply voltage level after completion of writing. This rising of potential on global data I/O line 904 is conducted to ground line 906 through parasitic capacitance 910, so that the potential on ground line 906 rises. Ground line 906 is electrically connected to nonselected sub-word line SWL. In accordance with potential rising caused by capacitive coupling of ground line 906, the potential on nonselected word line SWL rises, so that access transistor MT starts to be turned on, and electric charges accumulated in capacitor MQ flows onto bit line BL.

Particularly, semiconductor memory devices in these days employ a low power supply voltage of 2.0 V or lower and access transistor MT has a small threshold voltage. Therefore, in accordance with the rise of potential on nonselected sub-word line SWL, access transistor MT is turned on, and a relatively large leak current I1 flows from capacitor MQ to bit line BL. Leak current I1 flows every time data writing is performed in a fast serial access mode such as a page mode. As shown in FIG. 17, therefore, charges accumulated in memory capacitor MQ are gradually discharged, and the stored information is lost. This results in "disturb refresh failure", i.e., a problem that charges accumulated in memory capacitor MQ are discharged within a period shorter than the predetermined refresh cycle, and therefore the stored information in memory cell MC is lost. Since the global data I/O bus line and the ground line are provided commonly to the respective memory blocks in the column block, the parasitic capacitance 910 has a large capacitance value, and floating up of potential on the non-selected sub-word line occurs to a higher extent.

Global data I/O bus lines 902 and 904 are arranged adjacent to ground line 906, because it is necessary to arrange sub-decode lines 900 and 908 in accordance with the transistor pitch of the sub-decoder. Since the sub-decoder drives the sub-word line and has a relatively large current driving capability, the transistors thereof have a relatively large size. Therefore, the above arrangement is employed for sufficiently increasing an allowable size in the row direction for the sub-decoder.

Therefore, it is difficult to reduce the capacitive coupling between the ground line and the global data I/O line in the conventional layout of the sub-decoders.

SUMMARY OF THE INVENTION

An object of the invention is to provide a semiconductor memory device which has hierarchical data I/O lines and a hierarchical word line structure, and can reliably hold storage information.

Another object of the invention is to provide a semiconductor memory device which has hierarchical data I/O lines and a hierarchical word line structure, and has a layout of data I/O lines improving disturb refresh characteristics.

Yet another object of the invention is to provide a semiconductor memory device which has hierarchical word lines and a hierarchical data input/output structure, and has a layout of sub-decoders improving disturb refresh characteristics.

A semiconductor memory device according to the invention includes at least one row block having a plurality of memory blocks each having a plurality of memory cells arranged in rows and columns. The plurality of memory blocks in the row block are aligned in the row direction.

The semiconductor memory device according to the invention further includes a plurality of main word lines arranged commonly to the plurality of memory blocks and corresponding to the respective rows; a plurality of sub-word lines arranged in each of the plurality of memory blocks, corresponding to the respective rows, and each connected to the memory cells in the corresponding row in the corresponding memory block; global data lines arranged corresponding to the respective memory blocks, extending in the column direction, for transmitting data to and from the corresponding memory blocks; power supply lines arranged corresponding to the memory blocks for transmitting a voltage at a predetermined level, respectively; and a plurality of sub-decoders arranged corresponding to the respective rows in each of the memory blocks, for transmitting the voltages on the corresponding power supply lines onto the corresponding sub-word lines in the corresponding memory blocks in accordance with decode signals and signals on the corresponding main word lines.

The power supply lines and the global data lines are arranged along the column direction such that at least one conductive line is present between the power supply line and the global data line.

Since at least one conductive line is arranged between the global data line and the power supply line, it is possible to reduce the capacitive coupling between the global data line and the power supply line, so that it is possible to suppress variation in potential on the power supply line when the potential on the global data line varies. Thereby, it is possible to suppress variation in potential on the nonselected sub-word line. Thus, it is possible to suppress change of an access transistor in the memory cell to the turn-on state, so that a leak current is suppressed, and discharging of electric charges from the memory capacitor can be suppressed. Accordingly, the semiconductor memory device can have improved disturb refresh characteristics.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 schematically shows a structure of a main portion of a semiconductor memory device according to an embodiment 1 of the invention;

DESCRIPTION OF THE PREFERRED EMBODIMENTS

[Embodiment 1]

Figure 2:
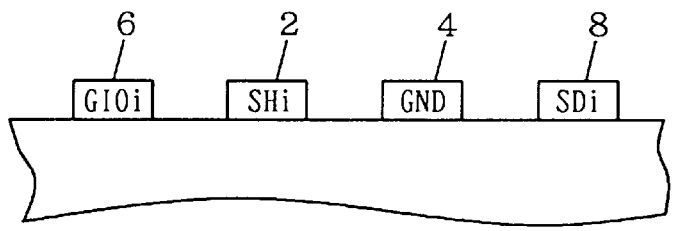
FIG. 2 schematically shows a layout of interconnections in a sub-decode band in the semiconductor memory device shown in FIG. 1.

FIG. 1 schematically shows a structure of a memory array in a semiconductor memory device according to an embodiment 1 of the invention. FIG. 1 schematically shows a portion related to two row blocks RB#i and RB#j. This memory array is divided into column blocks CB#0-CB#n. In row block RB#1, memory blocks MBi0-MBin are aligned in the row direction. In row block MB#j, memory blocks MBj0-MBjn are aligned in the row direction.

Similarly to the prior art device, a sense amplifier band extending in the row direction is arranged between the adjacent row blocks. More specifically, sense amplifier band SA#h extending in the row direction is arranged between row block RB#i and unillustrated row block (RB#h), and sense amplifier band SA#i is arranged between row blocks RB#i and RB#j. Sense amplifier band SA#j is arranged between row block RB#j and an unillustrated row block RB#k.

Similarly to the prior art device, each of sense amplifier bands SA#h, SA#i and SA#j is provided with a local data I/O bus corresponding to each respective memory block, and sense amplifiers SA arranged corresponding to respective columns in the corresponding memory blocks. However, these local data I/O buses and sense amplifiers SA are not shown in FIG. 1 for simplification of the figure.

A signal line for transmitting a sub-decode signal from a row decoder RD is arranged at each of regions of sense amplifier bands SA#h, SA#i and SA#j. In sense amplifier band SA#h, sub-decode signal bus SDAi is arranged along the row direction. In sense amplifier bands SA#i and SA#j, sub-decode buses SDBi and SDAi are arranged along the row direction, respectively. Main word lines for receiving a row select signal from row decoder RD are arranged for the rows respectively in the row block. FIG. 1 representatively shows only one main word line MWL provided corresponding to the row block RB#j.

The sub-decode bus includes local sub-decode buses extending in the column direction for transmitting the sub-decode signal to the memory block. Each memory block receives sub-decode signals from its opposite sides (in the row direction), and the sub-decoder (not shown) drives the sub-word line to the selected state.

Each local sub-decode bus extending in the column direction is arranged in sub-decode band SD#, which is arranged between the column blocks, and is provided only for the corresponding memory block. More specifically, in sub-decode band SD#0, local sub-decode buses LDBi0 and LDBj0 connected to sub-decode bus SDBi are provided for row blocks RB#i and RB#j, respectively. In sub-decode band SD#1, a local sub-decode bus LDAi0 connected to sub-decode bus SDAi is arranged for row block RB#i, and a local sub-decode bus LDAj0 connected to sub-decode bus SDAj is arranged for row block RB#j.

In sub-decode band SD#2 between column blocks CB#1 and CB#2, local sub-decode bus LDBi1 connected to sub-decode bus SDBi is arranged for row block RB#i, and local sub-decode bus LDBj1 is arranged for row block RB#j. In sub-decode band SD#3 between column block CB#2 and column block CB#3 (not shown), local sub-decode bus LDAi2 connected to sub-decode bus SDAi is arranged for row block RB#i, and local sub-decode bus LDAj2 connected to sub-decode bus SDAj is arranged for row block RB#j.

Likewise, in sub-decode band SD#n−1, local sub-decode bus LDBin connected to sub-decode bus SDBi is arranged for row block RB#i, and local sub-decode bus LDBjn is arranged for row block RB#j. In sub-decode band SD#n, local sub-decode bus LDAin connected to sub-decode bus SDAi is arranged for row block RB#i, and local sub-decode bus LDAjn connected to sub-decode bus SDAj is arranged for row block RB#j.

The sub-decoders included in the sub-decode band decode the sub-decode signals received through the local sub-decode bus, and drive the corresponding sub-word lines to the selected or nonselected state, respectively. In one row block, correlated sub-word lines in the memory blocks are selectively connected by a first level polycrystalline silicon interconnection layer. The sub-word lines are set to the selected or nonselected state in accordance with the decode results of the sub-decoders in this sub-decode band.

In each of sub-decode bands SD#0-SD#n, there is arranged a global data I/O bus which is provided commonly to the memory blocks included in the corresponding column block, and extends in the column direction for input/output of data. More specifically, global data I/O buses GB0-GBn extending in the column direction are arranged in sub-decode bands SD#0-SD#n, respectively. Each of global data I/O buses GB0-GBn includes a plurality of global data bus line pairs. Referring to FIG. 1, global data I/O buses GB0-GBn are arranged for the column blocks, respectively. However, each global data I/O bus may include a plurality of global data bus line pairs for input/output of data with respect to the adjacent column blocks.

Parallel to global data I/O buses GB0-GBn, there are arranged ground lines G0-Gn which transmit the ground voltages for holding the nonselected sub-word lines in the memory blocks at the ground voltage level. The ground voltages on these ground lines G0-Gn are transmitted onto the nonselected sub-word lines through the sub-decoders (not shown).

In each sub-decode band, there is arranged an interconnection SHx (SH0-SHn), which is located between global data I/O bus GBx (GB0-GBn) and ground line Gx (G0-Gn), extends in the column direction and functions as an electrostatic shield layer between ground line Gx and each global data I/O line included in global data I/O bus GB0. Each of electrostatic shield interconnections SH0-SHn is arranged between the global data I/O bus lines included in the corresponding global data I/O bus GB0 and the corresponding ground line. Each of electrostatic shield interconnections SH0-SHn may include a plurality of signal lines (reference voltage transmission lines). Shield interconnections SH0-SHn are formed of the same interconnection layer as the global data I/O bus lines included in the global data I/O buses and the ground lines. Owing to the structure in which electrostatic shield interconnections SH0-SHn are arranged between the global data I/O bus lines included in global data I/O buses GB0-GBn and corresponding ground lines G0-Gn, respectively, it is possible to suppress the capacitive coupling between the global data I/O lines included in the global data I/O buses and the ground lines, so that it is possible to prevent transmission of the potential variation on the global data I/O bus lines onto the ground lines, and the nonselected word lines can be reliably held at the nonselected state.

FIG. 2 schematically shows a layout of the signal lines on the sub-decode band shown in FIG. 1. In FIG. 2, shield interconnection (SHi) 2 is arranged between ground line (GND) 4 and global data I/O bus line (GIOi) 6. Sub-decode signal line (SDi) 8 is opposed to shield interconnection 2 with ground line 4 therebetween. Shield line 2, ground line 4, global data I/O bus line 6 and sub-decode signal line 8 are all formed at the same interconnection layer (second level aluminum interconnection layer). Owing to the structure in which shield interconnection 2 is arranged between global data I/O bus line 6 and ground line 4, it is possible to suppress capacitive coupling between global data I/O bus line 6 and the ground line 4, and it is possible to prevent transmission of the potential variation on the global data I/O bus line onto ground line 4.

Ground voltage GND on ground line 4 is transmitted onto the nonselected sub-word line through the sub-decoder (not shown). Thereby, the nonselected sub-word line is reliably held at the ground voltage level. In this structure, sub-decode signal line 8 is adjacent to ground line 4. Sub-decode signal SDi on sub-decode signal line 8 changes in accordance with the row address. Therefore, the number of times or frequency of variation in potential on sub-decode signal line 8 is smaller than that of variation in potential on the global data I/O bus line (in the case of a fast serial access mode such as a page mode), and the number of times of variation in potential on the nonselected sub-word line can be substantially negligible compared with the number of times of potential rise on the nonselected word line which occurs due to the capacitive coupling between the global data I/O bus line 6 and the ground line 4. Therefore, the leak current at the nonselected memory cell can be reliably suppressed, and the disturb refresh characteristics can be improved.

According to the embodiment 1 of the invention, since the shield interconnection is arranged between the global data I/O bus line and the ground line which is provided for driving the nonselected sub-word line to the nonselected state, capacitive coupling between the global data I/O bus line and the ground line can be suppressed, so that floating-up of the potential on the nonselected sub-word line can be reliably prevented, and the leak current at the nonselected memory cell can be suppressed. Therefore, the disturb refresh characteristics can be improved.

[Embodiment 2]

Figure 3:
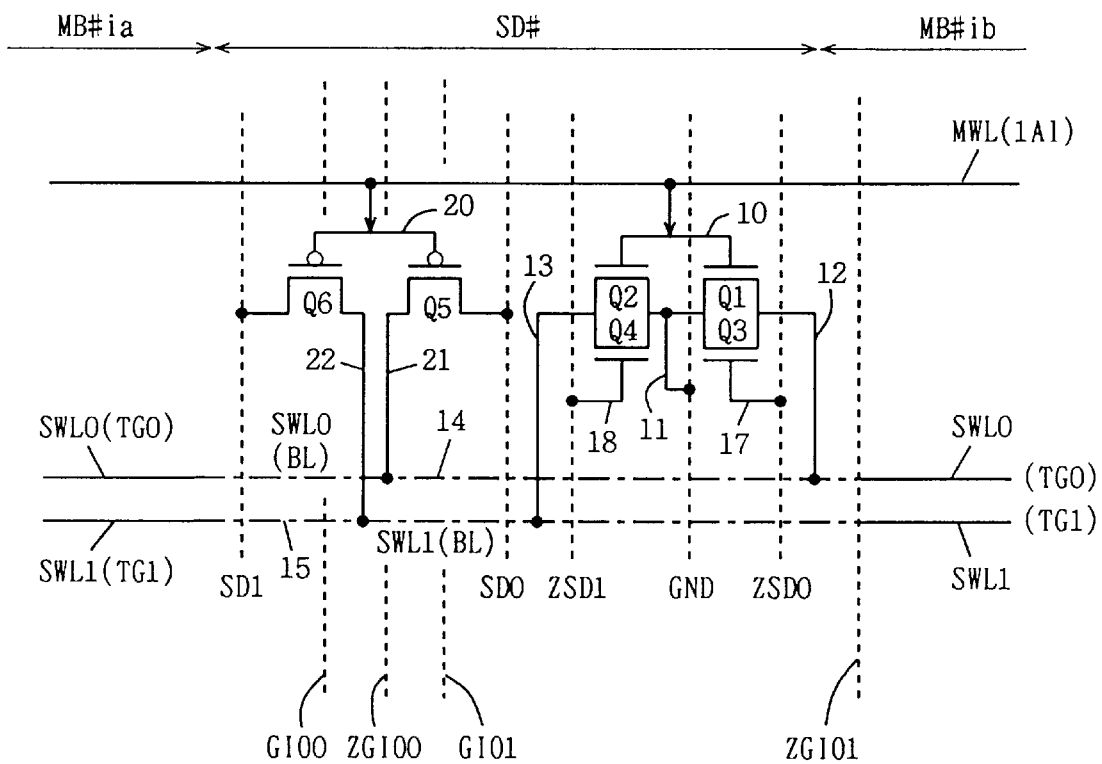
FIG. 3 schematically shows a structure of a main portion of a semiconductor memory device according to an embodiment 2 of the invention.

FIG. 3 shows a structure of a main portion of a semiconductor memory device according to an embodiment 2 of the invention. A structure of a portion related to one sub-decoder is shown in FIG. 3.

In FIG. 3, main word line MWL formed of a first level aluminum interconnection layer (1AL) extends in the row direction, and is arranged commonly to the plurality of memory blocks (MB#ia–MB#ib) included in the row block. In the sub-decode band SD#, local sub-decode signal lines ZSD0, ZSD1, SD0 and SD1 are arranged along the column direction for memory blocks MB#ia and MB#ib. Ground line GND (4) which extends in the column direction and is common to the memory blocks included in the column block is arranged between sub-decode signal lines ZSD0 and ZSD1.

Adjacent to a side of local sub-decode signal line ZSD0 facing to memory block MB#ib, there is arranged global data I/O bus line ZGIO1 extending in the column direction. Between local sub-decode signal lines SD0 and SD1, there are arranged global data I/O bus lines GIO1, ZGIO0 and GIO0 extending in the column direction. In the reference characters, "Z" represents a signal line transmitting a complementary signal.

According to the above arrangement, local sub-decode signal line ZSD0 is arranged between ground line GND and global data I/O bus line ZGIO1, and local sub-decode signal lines ZSD1 and SD0 are arranged between the ground line GND and global data I/O bus lines GIO1-GIO0. Therefore, these local sub-decode signal lines ZSD0, ZSD1 and SD0 function as shield lines to suppress the capacitive coupling between ground line GND and global data I/O bus lines ZGIO1 and GIO1-GIO0. Therefore, it is possible to reliably suppress floating up of ground voltage GND on ground line GND in the data write operation.

The sub-decoder includes n-channel MOS transistors Q1 and Q2 which transmit ground voltage GND on ground line GND onto sub-word lines SWL0 and SWL1, respectively, and n-channel MOS transistors Q3 and Q4 which transmit ground voltage GND on ground line GND onto sub-word lines SWL0 and SWL1, respectively.

MOS transistors Q1 and Q2 receive on their gates the signal on main word line MWL through signal line 10 formed of the first level aluminum interconnection layer. Each of MOS transistors Q1–Q4 has a source connected to ground line GND formed of the second level interconnection layer through a signal line 11 formed of the first level aluminum interconnection layer. One end (drain) of each of MOS transistors Q1 and Q3 is connected through a signal line 12 formed of the first level aluminum interconnection layer to a drive signal line 14 formed at the same interconnection layer as bit lines. This drive signal line 14 is electrically connected to a first level polycrystalline silicon interconnection (TG0) forming sub-word lines SWL0 in memory blocks MB#ia and MB#ib.

Drains of MOS transistors Q2 and Q4 are connected to a first level polycrystalline silicon interconnection (TG1) forming sub-word lines SWL1 in memory blocks MB#ia and MB#ib through first level aluminum interconnection 13, respectively. Gates of MOS transistors Q3 and Q4 are connected to local sub-decode signal lines ZSD0 and ZSD1 through interconnections 17 and 18 formed of the first level aluminum interconnection layer, respectively.

The sub-decoder further includes a p-channel MOS transistor Q5 which is turned on to transmit sub-decode signal SD0 onto sub-word line SWL0 when the signal on main word line MWL is at L-level, and a p-channel MOS transistor Q6 which is turned on to transmit sub-decode signal SD1 onto sub-word lines SWL in memory blocks MB#ia and MB#ib in response to the signal potential on main word line MWL. Gates of p-channel MOS transistors Q5 and Q6 are connected to main word line MWL through a signal line 20 formed of the first level aluminum interconnection layer. One conduction node of MOS transistor Q5 is connected to a first drive signal line 14 through a signal line 21 formed of the first level aluminum interconnection layer. One conduction node of MOS transistor Q6 is connected to a second drive signal line 15 through a signal line 22 formed of the first level aluminum interconnection layer.

When the main word line MWL is at the nonselected state of H-level, MOS transistors Q1 and Q2 are on, and MOS transistors Q5 and Q6 are off, so that ground voltage GND is transmitted onto sub-word lines SWL0 and SWL1 through MOS transistors Q1 and Q2, respectively. When main word line MWL is at the selected state of L-level, MOS transistors Q1 and Q2 are off, and MOS transistors Q5 and Q6 are on. In this state, the potentials on sub-word lines SWL0 and SWL1 depend on sub-decode signals SD0, SD1, ZSD0 and ZSD1.

The sub-decoder having the structure shown in FIG. 3 drives the adjacent two sub-word lines. A group of n-channel MOS transistors Q1–Q4 for driving the nonselected sub-word line to the nonselected state and a group of p-channel MOS transistors Q5 and Q6 for driving the selected sub-word line to the selected state are arranged at different regions, respectively. According to this structure, MOS transistors Q1–Q4 can be formed in the p-well, and p-channel MOS transistors Q5 and Q6 can be formed in the n-well. In contrast to the prior art, therefore, it is not necessary to form p- and n-channel MOS transistors in one sub-decoder, so that an area occupied by the well isolating region can be reduced, and therefore it is possible to provide the sub-decoder occupying a small area.

Figure 4:
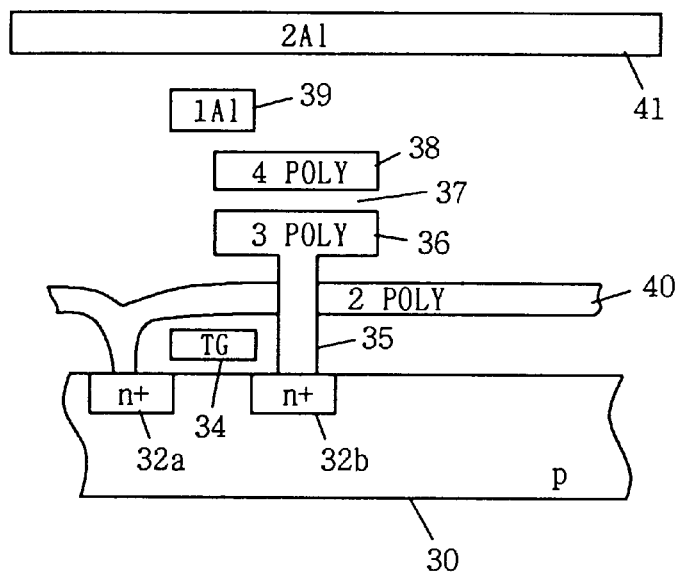
FIG. 4 schematically shows a layout of interconnections in a memory cell array.

FIG. 4 schematically shows an interconnection layout in the memory cell. The memory cell includes n-type impurity regions (n+) 32a and 32b formed at a surface of a p-type substrate region (epitaxial layer or well) 30, and a gate electrode 34 which is formed on a channel region between heavily doped impurity regions 32a and 32b with a gate insulating film (not shown) therebetween. The gate electrode 34 is formed of the first level polycrystalline silicon layer (TG).

The memory cell further includes a plug layer 35 electrically connected to n-type impurity region 32b, and a conductive layer 36 connected to plug layer 35 and having a flat cross sectional form. Plug layer 35 and conductive layer 36 are formed of the first level polycrystalline silicon layer, and form one electrode, i.e., storage node of a memory cell capacitor.

The memory cell capacitor has a conductive layer 38, which faces to conductive layer 36 with a capacitor insulating film 37 therebetween and functions as the other electrode. This electrode (cell plate electrode) is formed of a fourth level polycrystalline silicon layer.

The gate electrode 34 of the memory cell transistor is electrically coupled at the sub-decode band to a main word line 39 arranged parallel to gate electrode (TG) 34. Main word line 39 is formed of the first level aluminum interconnection layer.

N-type impurity region 32a in the memory cell transistor is connected to a bit line 40 which is formed of a second level polycrystalline silicon layer extending in the column direction and arranged under conductive layer 36. Along the extending direction (column direction) of the bit line 40, there is arranged a signal interconnection 41 which is formed of the second level aluminum interconnection layer forming the power supply line, ground line or sub-decode signal line.

In the layout shown in FIG. 3, the output signal of the sub-decoder is applied to the second level polycrystalline silicon layer at the same layer as the bit line, and drive signal lines 14 and 15 formed of the second level polycrystalline silicon layer are connected to the gate electrode interconnection (sub-word line) of the memory cell transistor formed of the first level polycrystalline silicon layer. Thereby, it is possible to achieve a layout which can efficiently shields the ground line from the global data I/O bus line without requiring an extra interconnection layer.

Figure 5:
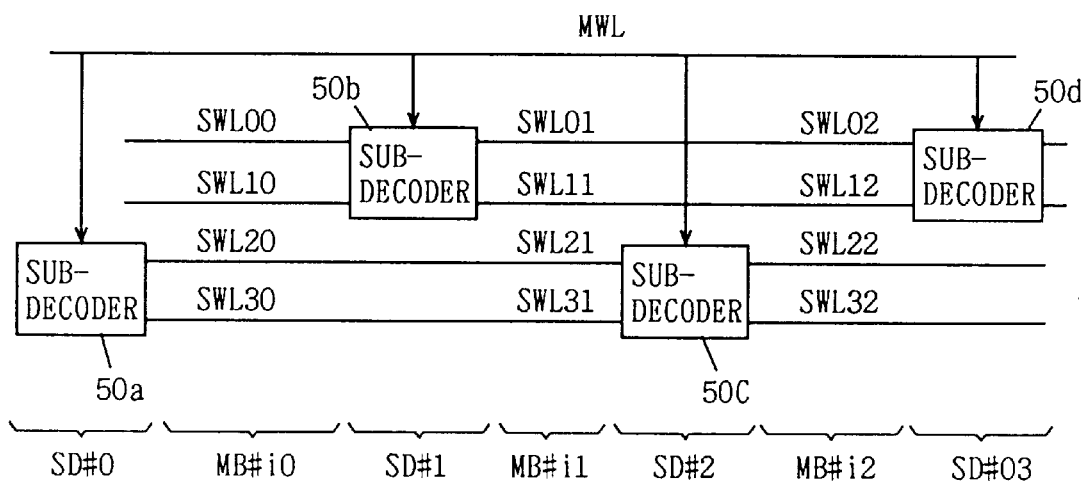
FIG. 5 schematically shows a form of arrangement of sub-decoders according to the embodiment 2 of the invention.

FIG. 5 schematically shows a structure of a portion related to one main word line MWL. An arrangement of sub-word lines in memory blocks MB#i0 to MB#i2 are schematically shown. For main word line MWL, sub-word lines SWL00–SWL30 are arranged in memory block MB#i0. In memory block MB#i1, sub-word lines SWL01–SWL31 are arranged for main word line MWL. In memory block MB#i2, sub-word lines SWL02–SWL32 are arranged for main word line MWL.

In sub-decode band SD#0, there is arranged a sub-decoder 50a which drives sub-word lines SWL20, SWL30, SWL21 and SLW31 in accordance with the signal potential on main word line MWL and the sub-decode signal (not shown). In sub-decode band SD#1, there is arranged a sub-decoder 50b which drives sub-word lines SWL00, SWL10, SWL01 and SWL11 in accordance with the signal potential on main word line MWL and the sub-decode signal (not shown).

In sub-decode band SD#2, there is arranged a sub-decoder 50c which drives sub-word lines SWL21, SWL31, SWL22 and SWL32 in accordance with the signal potential on main word line MWL and the sub-decode signal (not shown). In sub-decode band SD#3, there is arranged a sub-decoder 50d which drives sub-word lines SWL02 and SWL12 in accordance with the signal potential on main word line MWL and the sub-decode signal (not shown).

The pitch of the sub-decoders in the column direction is four times larger than the pitch of sub-word lines, so that the sub-decoder can be arranged with a sufficient margin.

The sub-word lines included in the row block are mutually connected by the first level polycrystalline silicon layer, and receive the select signals from the sub-decoders through the drive signal lines. Therefore, each sub-word line receives the drive signal from the sub-decoders at the opposite sides thereof, so that the sub-word line can be driven to the selected state at a high speed. Alternatively, the sub-word lines may be isolated by every other sub-decode band so that each sub-word line may be driven by one sub-decoder. In sub-decode band SD#1, for example, sub-word lines SWL20 and SWL30 may be isolated from sub-word lines SWL21 and SWL31. If the sub-word line is not present in this region, a pitch of the sub-decoders can be increased in the column direction.

In the arrangement shown in FIG. 3, the global data I/O bus lines may be arranged in any manner, provided that at least one signal line is arranged insertedly to the ground line GND.

In the arrangement shown in FIG. 3, sub-decode signal transmission lines ZSD0 and ZSD1 are adjacent to ground line GND. These sub-decode signals ZSD0 and ZSD1 change in accordance with change of the row address. Therefore, in the fast serial mode such as a page mode, sub-decode signals ZSD0 and ZSD1 usually change only one time, and the number of times of change is small. Therefore, even if floating up of the word line potential occurs, the number of times thereof is sufficiently smaller than the number of times of potential change on the global data I/O bus line, and generation of the leak current in the memory transistor due to potential floating up on the nonselected sub-word line occurs a sufficiently small number of times. Therefore, the influence by the leak current can be negligible. Change of the potentials of sub-decode signals ZSD0 and ZSD1 to H-level occurs when the word line is selected, and the bit line has been precharged to the intermediate voltage level when this change occurs. Therefore, even if the gate potential of a memory access transistor rises, the bit line potential is sufficiently higher than the gate potential of the memory cell transistor, and the memory cell transistor has the gate and source reverse biased, so that generation of the leak current is suppressed.

When the memory cell transistor has stored the data at L-level, this potential floating up may cause flow of electric charges into the memory cell capacitor from the precharged bit line. However, owing to the influence of the threshold voltage of the memory cell transistor, it is possible to suppress sufficiently the potential rise of the data at L-level in the memory cell capacitor at the time of this flow of charges. Therefore, disturb refresh failure hardly occurs.

According to the embodiment 2 of the invention, as described above, at least one signal line is arranged between the global data I/O bus line and the ground line which is provided for driving the nonselected sub-word line to the nonselected state. Therefore, floating up of the ground voltage can be prevented, and the nonselected memory cell can be reliably held at the nonselected state, so that leak of charges from the memory cell capacitor can be suppressed, and the disturb refresh characteristics can be improved.

[Embodiment 3]

Figure 6:
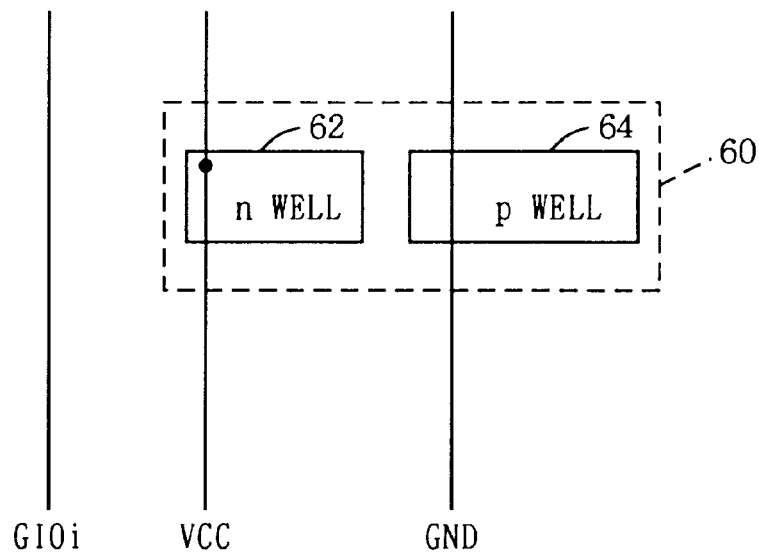
FIG. 6 schematically shows a structure of a main portion of a semiconductor memory device according to an embodiment 3 of the invention.

FIG. 6 schematically shows a structure of a main portion of a semiconductor memory device according to an embodiment 3 of the invention. In FIG. 6, a structure related to sub-decoder 60 is schematically shown. Sub-decoder 60 includes an n-well region 62 for forming p-channel MOS transistors (Q5 and Q6) and a p-well region 64 for forming n-channel MOS transistors (Q1–Q4). N-well region 62 is fixed at the power supply voltage level by power supply line VCC extending in the column direction. The MOS transistors formed at p-well region 64 transmit ground voltage GND on ground line GND onto the nonselected word line. P-well region 64 is biased to ground voltage GND level. Power supply line VCC having a large width and having a potential fixed is arranged between the ground line GND and global data I/O bus line GIOi. Thereby, the capacitive coupling between ground line GND and data I/O bus line GIOi can be reduced, and it is possible to suppress variation in potential on the nonselected sub-word line, which may be caused by variation in ground voltage GND and variation in potential on global data I/O bus line GIOi during data writing.

In the arrangement shown in FIG. 6, sub-decode signal lines are arranged appropriately. The n- and p-wells may extend in the column direction through the sub-decode band, to be provided commonly to the respective sub-decoders.

[Modification]

Figure 7:
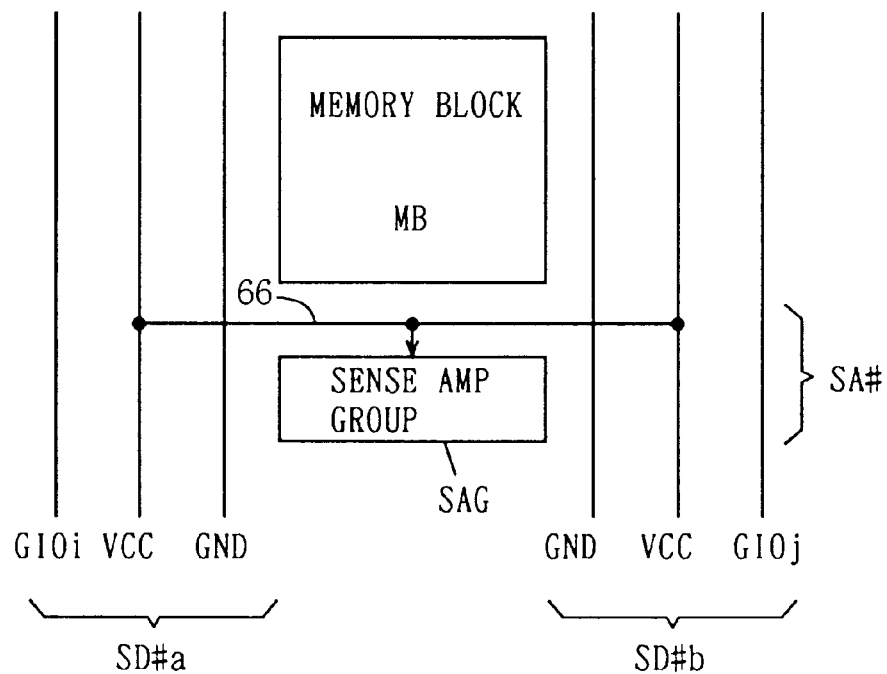
FIG. 7 schematically shows a structure of a modification of the embodiment 3 of the invention.
Figure 8:
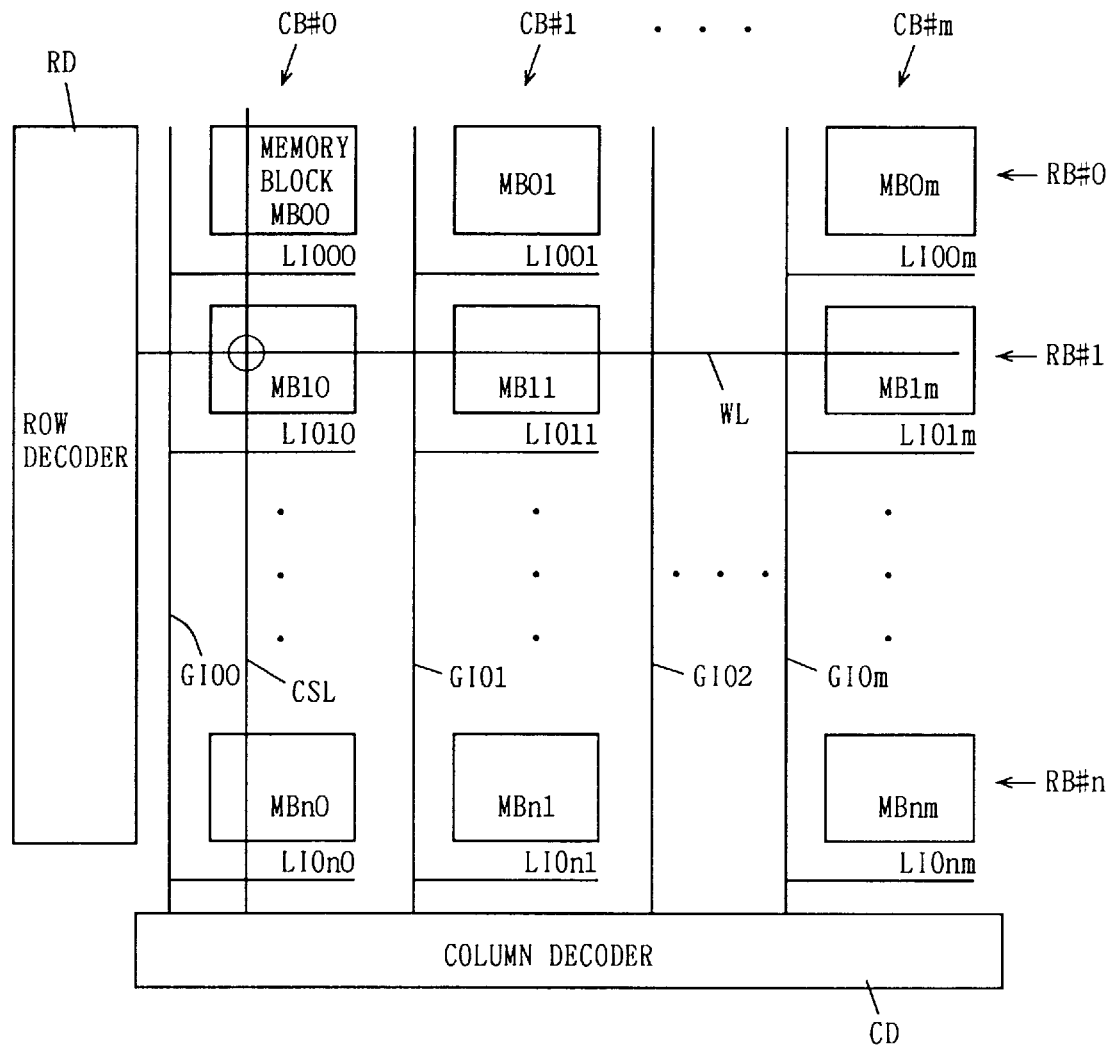
FIG. 8 schematically shows a structure of a main portion of a semiconductor memory device in the prior art.
Figure 9:
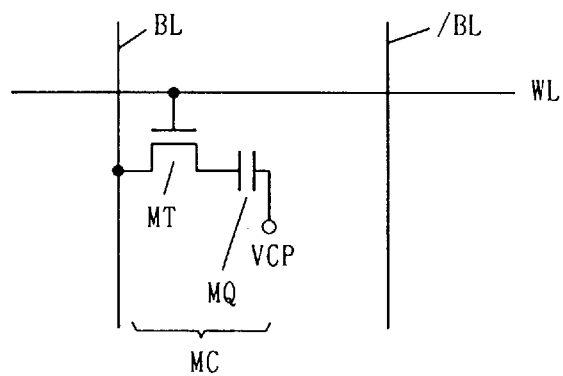
FIG. 9 schematically shows a structure of a memory cell in the conventional semiconductor memory device.
Figure 10:
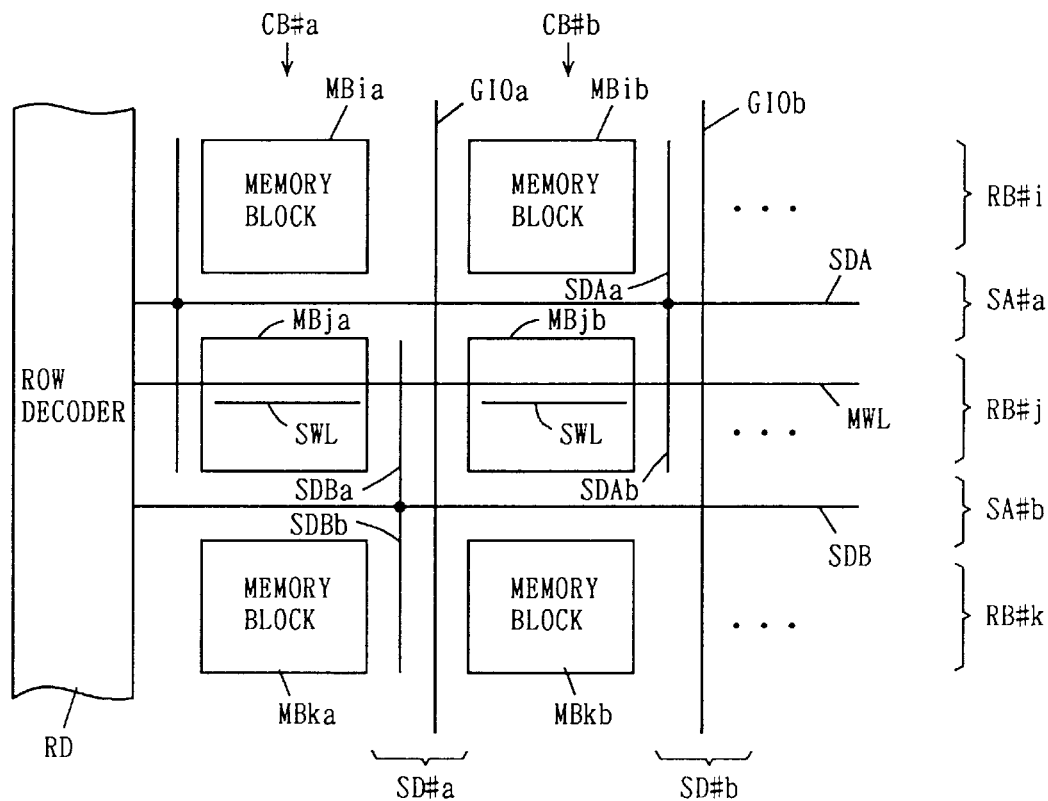
FIG. 10 schematically shows a structure of a memory cell array in a conventional semiconductor memory device having a hierarchical word line structure.
Figure 11:
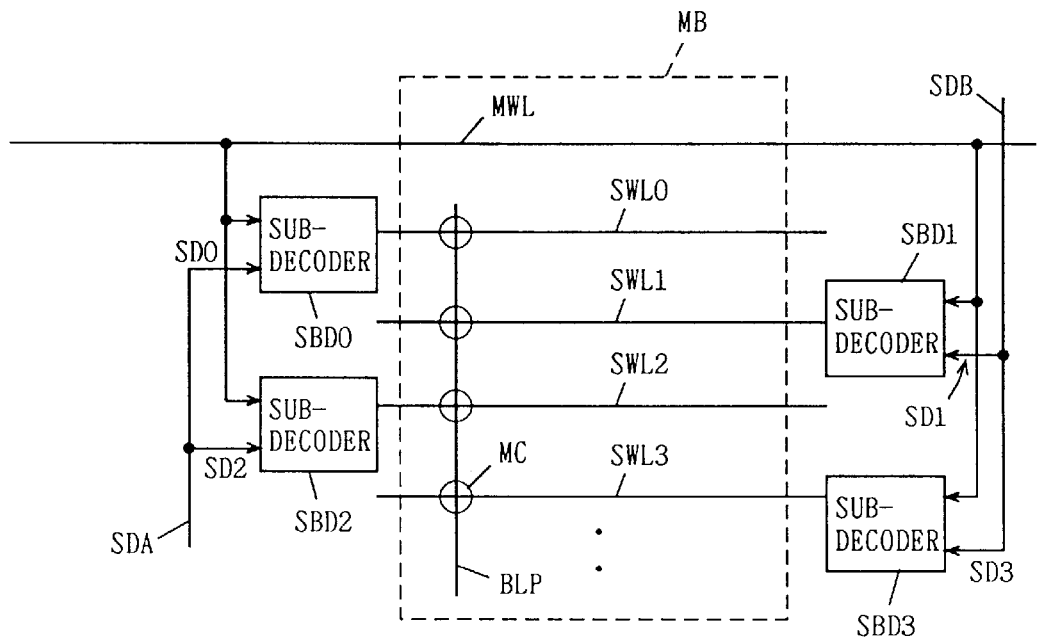
FIG. 11 schematically shows a structure of a portion related to one main word line in one memory block of the memory array shown in FIG. 10.
Figure 12:
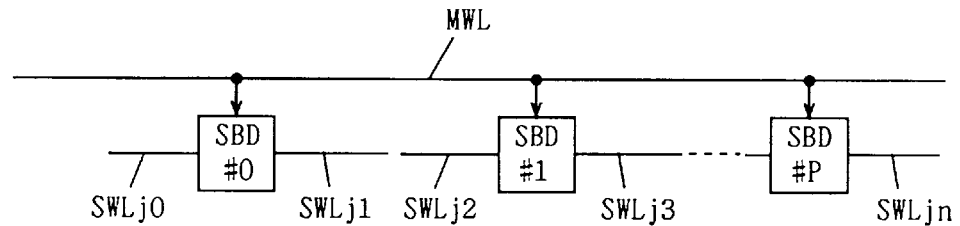
FIG. 12 schematically shows a structure of a portion related to one row in one row block in the semiconductor memory device shown in FIG. 10.
Figure 13:
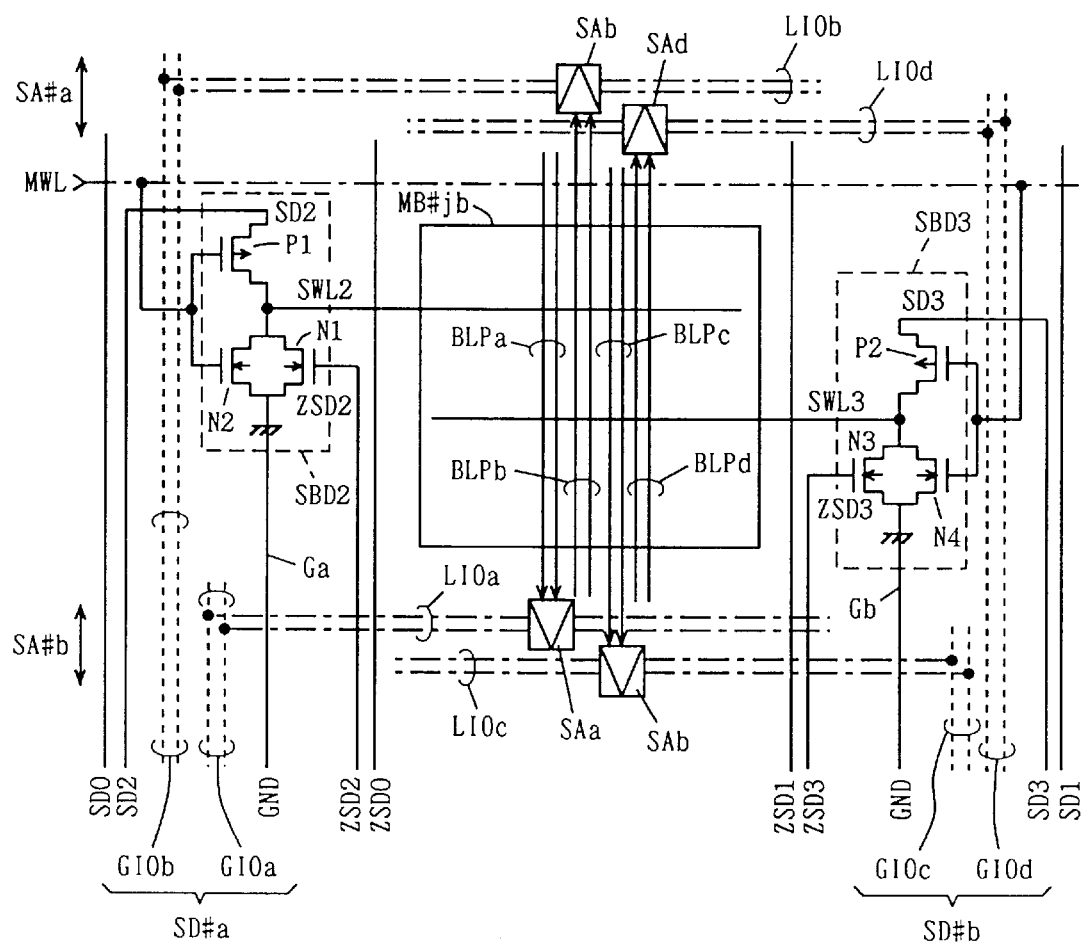
FIG. 13 shows more specifically a structure of a portion related to one memory block in the semiconductor memory device shown in FIG. 10.
Figure 14:
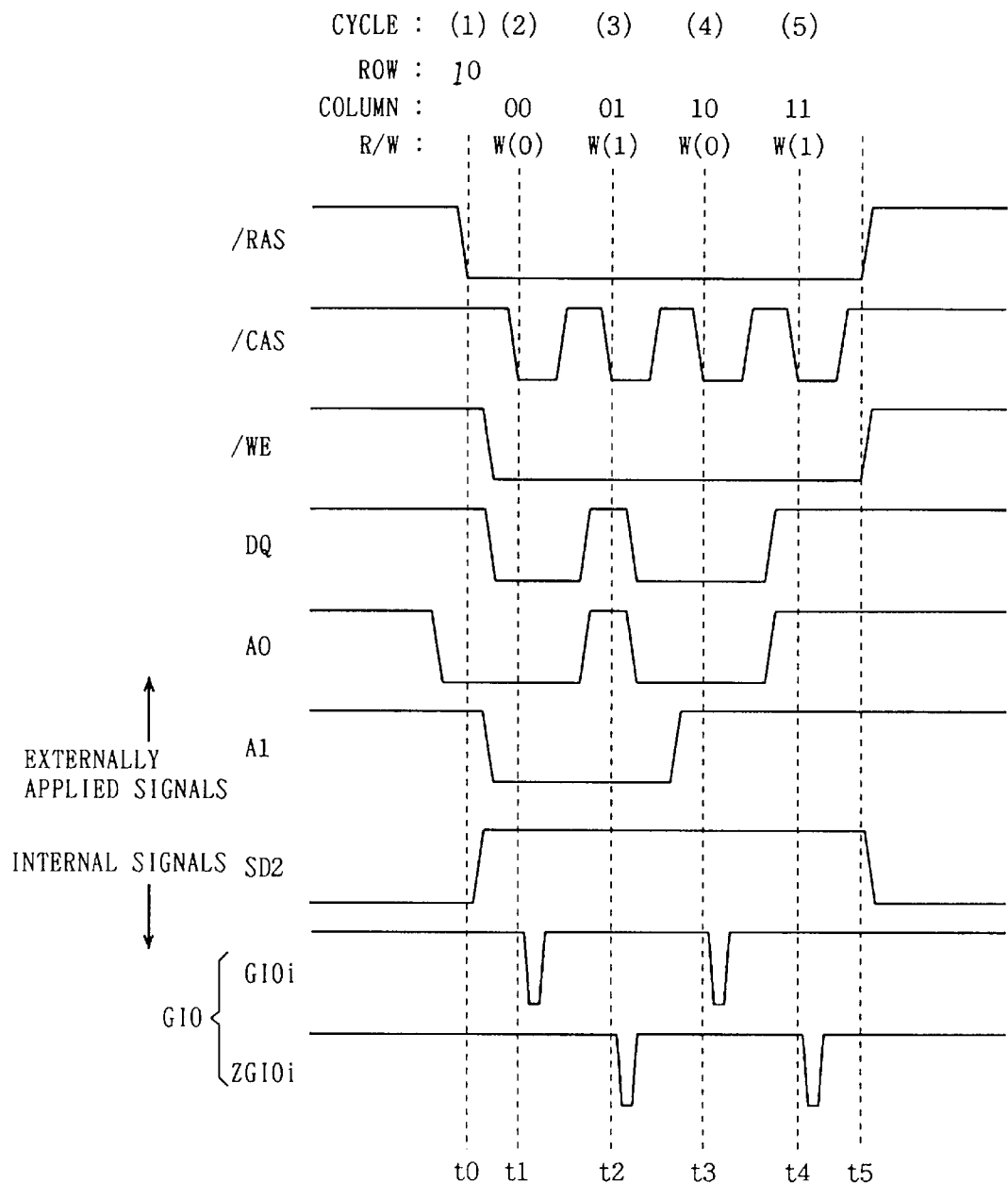
FIG. 14 is a signal waveform diagram representing an operation of the semiconductor memory device shown in FIG. 13.
Figure 15:
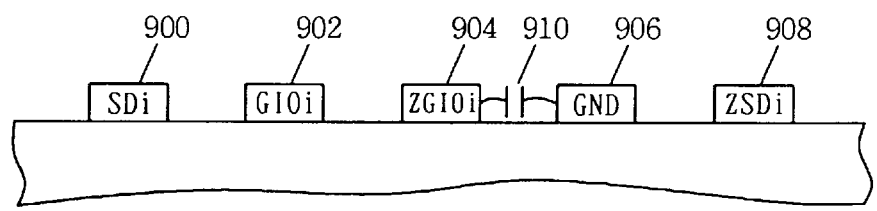
FIG. 15 schematically shows an interconnection layout in the semiconductor memory device shown in FIG. 10.
Figure 16:
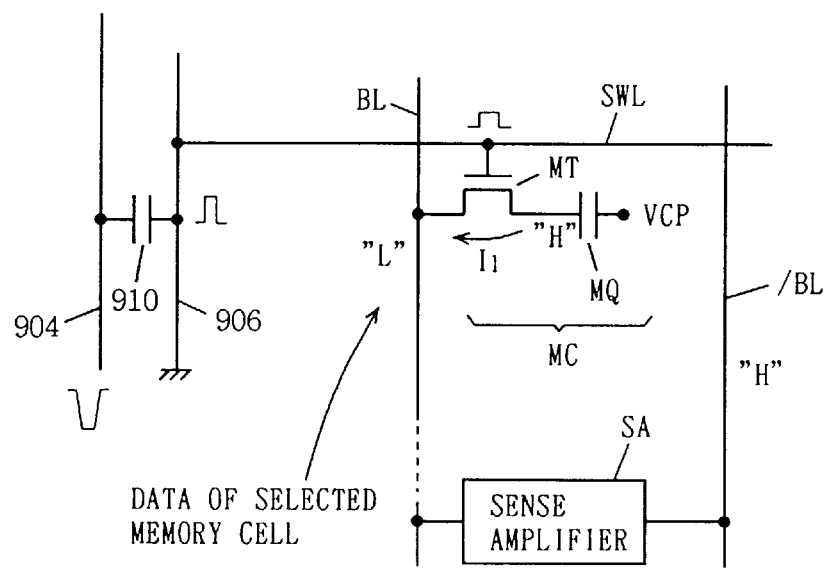
FIG. 16 illustrates a problem of the semiconductor memory device shown in FIG. 10.
Figure 17:
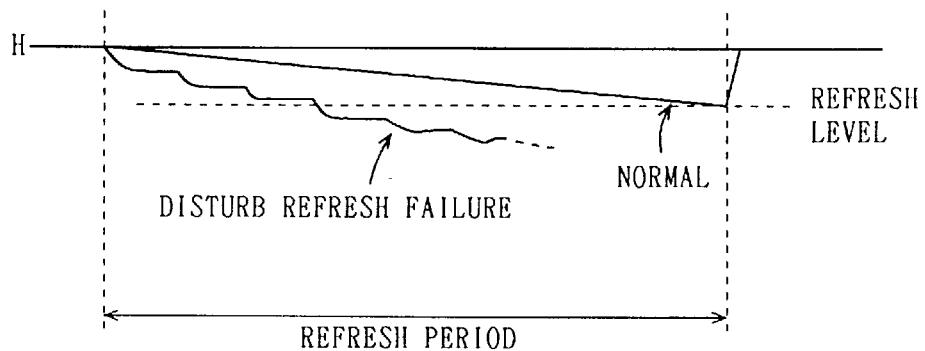
FIG. 17 schematically shows variation in accumulated charges due to a leak current in a memory cell shown in FIG. 16.

FIG. 7 shows a structure of a modification of the embodiment 3 of the invention. In the structure shown in FIG. 7, ground lines GND, power supply lines VCC and global data I/O bus lines GIOi and GIOj extend in the column direction through the sub-decode bands at the opposite sides of memory block MB. Power supply line VCC in sub-decode band SD#a and power supply line VCC in sub-decode band SD#b are connected together by an interconnection (sub-power supply line) 66 which is formed of, for example, the first level aluminum interconnection layer along the column direction at the sense amplifier band SA#. Sub-power supply line 66 serves as one operational power supply of each sense amplifier included in sense amplifier band SA#.

In the arrangement shown in FIG. 7, power supply lines VCC at the fixed potential are arranged between ground line GND and global data I/O bus lines GIOi and GIOj, respectively, similarly to the structure already described. Therefore, the capacitive coupling between the global data I/O bus line and ground line GND can be suppressed, and the potential of ground voltage GND can be stably fixed at the ground voltage level.

The interconnection line arranged between the global data I/O bus line and ground line GND may be replaced with another interconnection line provided that the potential on the other interconnection line does not change frequently, and for example, this interconnection line may be an intermediate voltage transmitting line or the like.

According to the embodiment 3 of the invention, as described above, the reference voltage transmitting line for transmitting the constant reference voltage is arranged between the global data I/O bus line and the ground line supplying the ground voltage to be transmitted onto the nonselected sub-word line. Therefore, the capacitive coupling between the global data I/O bus line and the ground line can be suppressed, and thereby floating up of the potential on the nonselected sub-word line can be prevented, so that current leak at the nonselected memory cell can be suppressed, and thereby the disturb refresh characteristics can be improved.

[Still Another Embodiment]

In the embodiments described above, four local data I/O line pairs and four global data I/O bus line pairs are arranged for each memory block. However, the number of the local data I/O bus line pairs and the number of the global data I/O bus line pairs may be appropriately determined. Also, the number of the sub-word lines provided corresponding to one main word line is not restricted to four.

According to the invention, as described above, a conductive line (sub-decode line or power supply line) on which signal variation does not occur frequently is arranged between the global data I/O bus line and the power supply line which is provided for driving the nonselected word line to the nonselected state. Thereby, it is possible to suppress the capacitive coupling between the reference voltage transmission line and the global data I/O bus line, and therefore variation in potential on the nonselected word line, which may occur due to disturbance by adjacent interconnection lines, can be reduced, so that generation of the disturb refresh failure can be significantly reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   at least one row block having a plurality of memory blocks each having a plurality of memory cells arranged in rows and columns, said plurality of memory blocks in said at least one row block being aligned in a row direction;
   a plurality of main word lines extending in said row direction over said plurality of memory blocks, and arranged corresponding to the respective rows in each of said plurality of memory blocks;
   a plurality of sub-word lines arranged within each of said plurality of memory blocks and corresponding to the rows in said each of the memory blocks, each of the sub-word lines being connected to the memory cells in a corresponding row;
   a plurality of global data lines arranged corresponding to said memory blocks respectively and extending in a column direction, for transmitting data to and from corresponding memory blocks when the corresponding memory blocks are selected;
   a plurality of power source lines arranged corresponding to the memory blocks and extending in said column direction, for transmitting a predetermined voltage;
   at least one conductive line arranged between a global data line of said plurality of global data lines and a corresponding power source line of said plurality of sower source lines, and
   a plurality of sub-decoders arranged corresponding to the memory blocks and corresponding to the respective rows in corresponding memory blocks, each for transmitting the predetermined voltage on a corresponding power source line onto a corresponding sub-word line in accordance with a decode signal and a signal signal on a corresponding main word line.

2. The semiconductor memory device according to claim 1, wherein said decode signal is transmitted to each the sub-decoder in a corresponding memory block through a decode signal transmission line arranged along said column direction and arranged corresponding to the corresponding memory block, and at least one decode signal transmission line is arranged, as said at least one conductive line, between the power source line and a corresponding global data line.

3. The semiconductor memory device according to claim 1, wherein said at least one conductive line, the power source line and the global data line are formed of a same common interconnection layer.

4. The semiconductor memory device according to claim 1, wherein said at least one conductive line is a reference voltage transmission line for transmitting a fixed potential.

5. The semiconductor memory device according to claim 1, wherein each of the main word lines specifies a plurality of sub-word lines in each of said plurality of memory blocks, and said decode signal designates one of the specified sub-word lines, and wherein the each of said plurality of sub-decoders includes:

first and second decode signal transmission lines for transmitting first and second decode signals in said column direction at opposite sides of the corresponding power source line, first and second insulated gate field-effect transistors of a first conductivity type rendered turned on to transmit the voltage on the corresponding power source line in response to the signal potential on the corresponding main word line, third and fourth insulated gate field-effect transistors of the first conductivity type arranged parallel to said first and second insulated gate field-effect transistors, and rendered turned on to transmit the voltage on said corresponding power source line in response to the signals on said first and second decode signal transmission lines, first and second drive signal transmission lines arranged parallel to first and second sub-word lines, electrically connected to said first and second sub-word lines respectively and formed of a same common interconnection layer as bit lines, a first interconnection line formed between said first and second drive signal transmission lines and said first and second decode signal transmission lines for transmitting output signals of said first and third insulated gate field-effect transistors onto said first drive signal transmission line, a second interconnection line formed of a same common layer as said first interconnection line for transmitting output signals of said second and fourth insulated gate field-effect transistors onto said second drive signal transmission line, third and fourth decode signal transmission lines formed at opposite sides of the corresponding global data line for transmitting signals complementary to said first and second decode signals respectively, a first insulated gate field effect transistor of a second conductivity type responsive to the signal potential on said corresponding main word line for being rendered turned on to transmit the signal on said third decode signal transmission line onto said first drive signal line through a third interconnection line formed of the same interconnection layer as said first interconnection line, and a second insulated gate field effect transistor of the second conductivity type, responsive to the signal potential on said corresponding main word line for being rendered turned on to transmit the signal on said fourth decode signal transmission line onto said second drive signal transmission line through a fourth interconnection line formed of the same interconnection layer as said first interconnection line; and said bit lines are arranged corresponding to the respective columns in each of the memory blocks, and are connected to the memory cells in corresponding columns.

6. The semiconductor memory device according to claim 1, wherein said at least one row block includes a plurality of row blocks, and wherein said global data lines are arranged extending over said plurality of row blocks in regions between memory blocks adjacent in the row direction.

7. The semiconductor memory device according to claim 1, further comprising a global decode line arranged extending in the row direction and for each respective memory block for transferring the decode signal to the decode signal transmission line in the each respective memory block.

8. The semiconductor memory device according to claim 1, wherein the sub-decoders are provided one for a predetermined number of sub-word lines in each of the memory blocks, the predetermined number being at least two.

9. The semiconductor memory device according to claim 1, wherein said global data lines are arranged over-lying the sub-decoders.

10. The semiconductor memory device of claim 1, wherein the at least one conductive line is configured to provide an electrostatic shield between the power source line and the global data line.

11. The semiconductor memory device according to claim 1, wherein said global data line, said power source line and said at least one conductive line are arranged corresponding to same memory block in a row block.

* * * * *